(12) United States Patent
Plucinski et al.

(10) Patent No.: US 10,944,191 B1
(45) Date of Patent: Mar. 9, 2021

(54) OFFSET ;LUG CONNECTOR ON A BOARD CONNECTION AREA

(71) Applicant: INTERNATIONAL BUSINESS MACHINES CORPORATION, Armonk, NY (US)

(72) Inventors: Mark Plucinski, Toms River, NJ (US); Phillip V. Mann, Rochester, MN (US); Sandra J. Shirk/Heath, Rochester, MN (US); Tyler Jandt, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/552,043

(22) Filed: Aug. 27, 2019

(51) Int. Cl.
*H01R 12/71* (2011.01)

(52) U.S. Cl.
CPC .................. *H01R 12/716* (2013.01)

(58) Field of Classification Search
CPC ...... H01R 12/716; H01R 12/00; H01R 12/52; H01R 12/59; H01R 12/77; H01R 12/721; H01R 13/6658; H01R 9/24; H01R 13/514; H05K 1/0203; H05K 1/0209; H05K 7/20; H05K 7/20154
USPC ............... 439/78, 67, 77, 329, 487, 629, 65, 439/620.22, 709; 361/719
See application file for complete search history.

(56) References Cited

U.S. PATENT DOCUMENTS

| 4,527,285 A * | 7/1985 | Kekas .................... G06F 1/183 359/599 |
| 5,037,313 A | 8/1991 | Linden et al. |
| 7,667,972 B2 | 2/2010 | Chen et al. |
| 8,911,244 B2 | 12/2014 | Elison et al. |
| 9,324,678 B2 | 4/2016 | Ganesan et al. |
| 9,374,165 B2 * | 6/2016 | Zbinden ............... G02B 6/4279 |
| 9,385,457 B2 | 7/2016 | Chawla et al. |
| 10,256,578 B2 | 4/2019 | Jandt et al. |
| 2015/0118870 A1* | 4/2015 | Swaminathan .......... H05K 7/10 439/65 |
| 2019/0044299 A1 | 2/2019 | Kazav et al. |

* cited by examiner

*Primary Examiner* — Travis S Chambers
(74) *Attorney, Agent, or Firm* — Cantor Colburn-LLP; Bryan Bortnick (57) ABSTRACT

An electric packaging including a board and a mechanical component attached to the board. The mechanical component includes a first end attached to the board, a second end opposite the first end, and a seat interposed between the first end and the second end. The mechanical component also includes an upper portion extending from the second end to the seat, the upper portion having a first width and a lower portion extending from the seat to the first end. The lower portion having a second width that is less than the first width. The electric packaging also includes a connector attached to the board. The connector includes a first surface attached to the board and a second surface located opposite the first surface. The second surface includes a plug connection area sized to receive a plug and located completely radially outside of the first width.

20 Claims, 4 Drawing Sheets

OFFSET ;LUG CONNECTOR ON A BOARD CONNECTION AREA

BACKGROUND

The present invention generally relates to electronic packaging, and more specifically, to electric packaging using electronic connectors that allows for removal of plugs without disturbing associated mechanical components.

A board has an array of electrical contacts on a face of the device, instead of having pins or other contacts around a perimeter of the device. An array of contact pads provides far more electrical connections than do contacts around a perimeter. Boards also have heat conduction and electrical performance advantages. Boards can be electrically connected by using a socket, or by directly soldering the contact pads to form connections. The boards may need to be electronically connected to various plugs for electronic data transmission and/or electric power transmission.

SUMMARY

Embodiments of the present invention are directed to offset connectors.

According to one or more embodiments of the present invention, an electronic packaging is provided. The electric packaging includes a board and a mechanical component attached to the board. The mechanical component includes a first end attached to the board, a second end opposite the first end, and a seat interposed between the first end and the second end. The seat including a seat surface in a facing spaced relationship with the board. The mechanical component also includes an upper portion extending from the second end to the seat, the upper portion having a first width and a lower portion extending from the seat to the first end. The lower portion having a second width that is less than the first width, such that a notched area is formed between the seat surface and the board. The electric packaging also includes a connector attached to the board. The connector includes a first surface attached to the board and a second surface located opposite the first surface. The second surface includes a plug connection area sized to receive a plug. The plug connection area is located completely radially outside of the first width.

According to another embodiment of the present invention, an electronic packaging is provided. The electronic packaging includes a board and a mechanical component attached to the board. The mechanical component being centered on a central axis. The mechanical component includes a first end attached to the board, a second end opposite the first end, and a seat interposed between the first end and the second end. The seat including a seat surface in a facing spaced relationship with the board. The mechanical component also includes an upper portion extending from the second end to the seat. The upper portion comprising a radially outward wall oriented about perpendicular to the board and located at a first distance away from the central axis. The mechanical component further includes a lower portion extending from the seat to the first end and a connector attached to the board. The connector includes a first surface attached to the board and a second surface located opposite the first surface. The second surface including a plug connection area sized to receive a plug. The plug connection area is completely located at a second distance away from the central axis that is greater than the first distance.

According to another embodiment of the present invention, a connector configured to electrically connect to a board is provided. The connector includes a first surface comprising a board connection area and connector tails configured to electrically connect to a board. The connector tails being located within the board connection area. The connector also includes a second surface located opposite the first surface. The second surface including a plug connection area sized to receive a plug. The plug connection area is horizontally offset from the board connection area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiment of the present invention provide an electrical connector for alleviating the need to remove the mechanical component when disconnecting the plugs.

A board may be connected to plugs through vertical connectors. A mechanical component may be attached to the board proximate the plugs. An obstruction either attached to the mechanical component or in the form of the mechanical component itself may prevent the removal of the plugs without removing the mechanical component.

One or more embodiments of the present invention provide technological improvements over current methods to that require removal of the mechanical component to remove plugs. One or more embodiments of the present invention provide technical solutions to one or more of these disadvantages of existing solutions by using an electrical connector for alleviating the need to remove the mechanical component when disconnecting the plugs by moving the plugs outside of the mechanical component.

Referring now to FIGS. 1, 2, 3, and 4 illustrate an electronic packaging 100 of a board 104, a connector 120, a plug 140, a mechanical component 130, and a fastening mechanism 119. FIGS. 1-4 illustrate electronic packaging 100 having different types of connectors 120, as described herein.

The mechanical component 130 may be a heat sink, circuit card, sheet metal, bracket, chassis, water hose, or any mechanical component known to one of skill in the art. The heat sink may be a fan, heat radiator, and/or any other heat radiating device known to one of skill in the art. The fastening mechanism 119 secures the mechanical component 130 to the board 104. The fastening mechanism 119 may be a screw or spring loaded clip.

In the depicted embodiment, the board 104 is a planar element that provides structural support and electrical connections. The board 104, in one embodiment, may include multiple layers, such as electrically conductive layers, insulating layers, structural support layers, stiffening layers, heat dissipation layers, and the like. In one embodiment, the board 104 is a printed board that may include one or more copper sheets laminated onto a non-conductive dielectric substrate using epoxy resin or the like.

One or more connectors 120 may be included in the electronic packaging 100. The connector 120 provides electrical connections between the board 104 and the plug 140. The connector 120 provides electrical connections from the board 104 and the plug 140 to other electrical devices. The connector 120, in one embodiment, is formed of a durable, insulating material, such as a plastic, ceramic, or the like. In a further embodiment, the connector 120 may include multiple layers of materials, such as electrically conductive layers, insulating layers, structural support layers, stiffening layers, heat dissipation layers, and the like. In another embodiment, the connector 120 is formed of a plastic or other polymer material using an injection molding process.

The connector 120, in the depicted embodiment, has a first surface 126 attached to the board 104. The first surface 126 includes with the connector tails 122 that are configured to electrically connect to board 104. The connector 120, in the depicted embodiment, has a second surface 128 opposite the first surface 126 with the connector contacts 124 that provide electrical connections for plug contacts 142 of the plugs 140. In the depicted embodiment, the plug 140 is plugged directly (i.e., connected or attached) into the connector 120 by plugging the contacts 142 of the plugs 140 into the connector contact 124 of the connector 120.

While two connector tails 122, connector contacts 124, and plug contacts 142, are depicted in the cross-sectional views of FIGS. 1-4 for clarity, in further embodiments, other numbers may be used. For example, in one embodiment, the electronic packaging 100 may include large arrays of tens, hundreds, or thousands of connector tails 122, connector contacts 124, and plug contacts 142, or the like. One of skill in the art, in view of this disclosure, will recognize other patterns, numbers, and arrangements of connector tails 122, connector contacts 124, and plug contacts 142 that may be used.

In the depicted embodiment, the connector tails 122 are disposed on the first surface 126 of the connector 120, facing the board 104. The connector tails 122 are electrically conductive, and may be formed of one or more electrically conductive materials such as copper, gold, nickel, and/or another electrically conductive material. The connector tails 122 may include an alloy, may be plated, or may be otherwise finished or treated to facilitate electrical connections, prevent corrosion, and the like.

In the depicted embodiment, the connector tails 122 provide electrical connections for the board 104. In the depicted embodiment, the connector 120 is mounted directly onto the board 104 by plugging the connector tails 122 into the board 104. Alternatively, the connector 120 may be mounted to the board 104 by a pin through hole, surface mount technology, ball grid array (BGA), compliant pin, or any mounting technology known to one of skill in the art. There may be pads on the surface of the board or vias down into the board for mounting.

In the depicted embodiment, the connector contacts 124 extend into the second surface 128 of the connector 120, facing the plug 140. The connector contacts 124 are electrically conductive, and may be formed of one or more electrically conductive materials such as copper, gold, nickel, and/or another electrically conductive material. The connector contacts 124 may include an alloy, may be plated, or may be otherwise finished or treated to facilitate electrical connections, prevent corrosion, and the like. In one embodiment, the connector contacts 124 are formed of the same material as the connector tails 122. In a further embodiment, the connector contacts 124 may be integrally connected with the connector tails 122 and formed of a continuous piece of material. The connector contacts 124, in the depicted embodiment, provide electrical connections for corresponding plug contacts 142.

In the depicted embodiment, each connector contact 124 is integrated with an opposite connector tail 122, providing a direct one-to-one pass-through electrical connection between plugs 140 and the board 104. In a further embodiment, the connector 120 may include one or more internal electrical connections 125 that route electrical connections between connector contacts 124 and connector tails 122. An internal electrical connection 125 within the connector 120 may electrically connect a connector tail 122 and a connector contact 124 that are aligned. In an embodiment, the internal electrical connections 125 are each equivalent in length, regardless of the shape of the connector 120.

In the depicted embodiment, the connector contacts 124 are integrally connected with the connector tails 122 and are formed of a continuous piece of material. For example, in one embodiment, a connector contact 124 and a corresponding connector tail 122 may be stamped from a single sheet of electrically conductive material, formed from a single electrically conductive wire, or the like. In a further embodiment, the connector contacts 124 and corresponding connector tails 122 may be constructed of separate materials that are electrically coupled. For example, the connector contacts 124 and corresponding connector tails 122 may be electrically coupled by internal electrical connections 125 within the connector 120, through contact with a conductor, by welding, by soldering, through electrical connectors, or the like.

In one embodiment, the connector 120 has several through holes. In a further embodiment, the connector tails 122 extend from openings of the holes on the first side of the connector 120 and the connector contacts 124 are located within opposite openings of the holes on the second side of the connector 120. In one embodiment, a conductor extends through the hole between a connector tail 122 and a connector contact 124 to electrically couple the connector tail 122 and the connector contact 124. In one embodiment, the connector contacts 124 and/or the connector tails 122 may be inserted into the connector 120 using a staking or stitching process.

The electronic packaging 100 may be located about centered on a central axis A, as shown in FIGS. 1-4. The mechanical component 130 may be located about centered on a central axis A, as shown in FIGS. 1-4. The mechanical component 130 includes a first end 130C attached to the board 104 and a second end 130D opposite the first end 130C. The mechanical component 130 is attached to the board 104 at the first end 130C via the fastening mechanism 119. The mechanical component 130 includes an upper portion 130A and a lower portion 130B opposite the upper portion 130A. The mechanical component 130 is attached to the board 104 at the lower portion 130B via the fastening mechanism 119.

Figure 1:
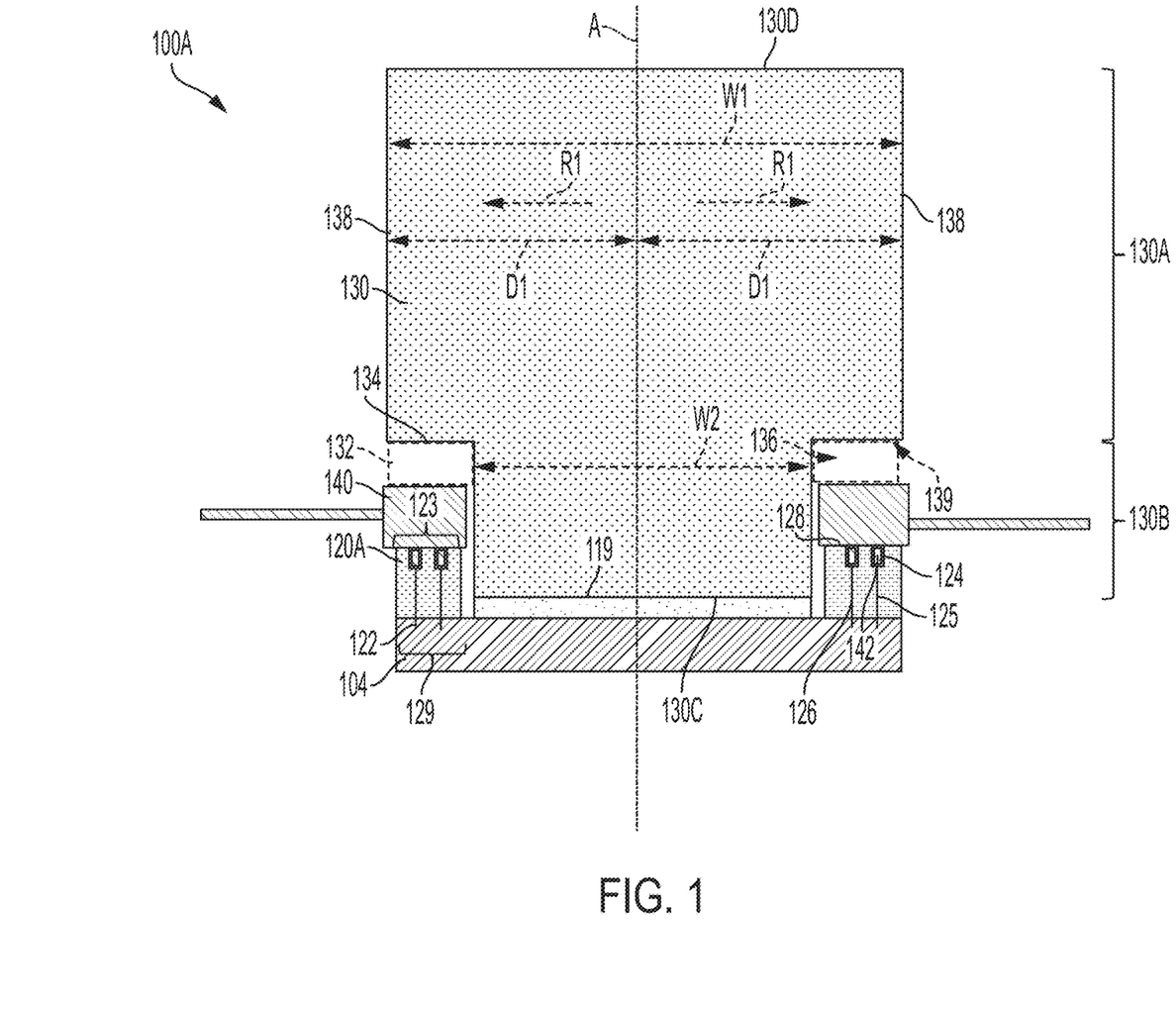
FIG. 1 is an illustration of electronic packaging locating a connector between a plug and a board within the notched area of a mechanical component, in accordance with an embodiment of the present disclosure.
Figure 2:
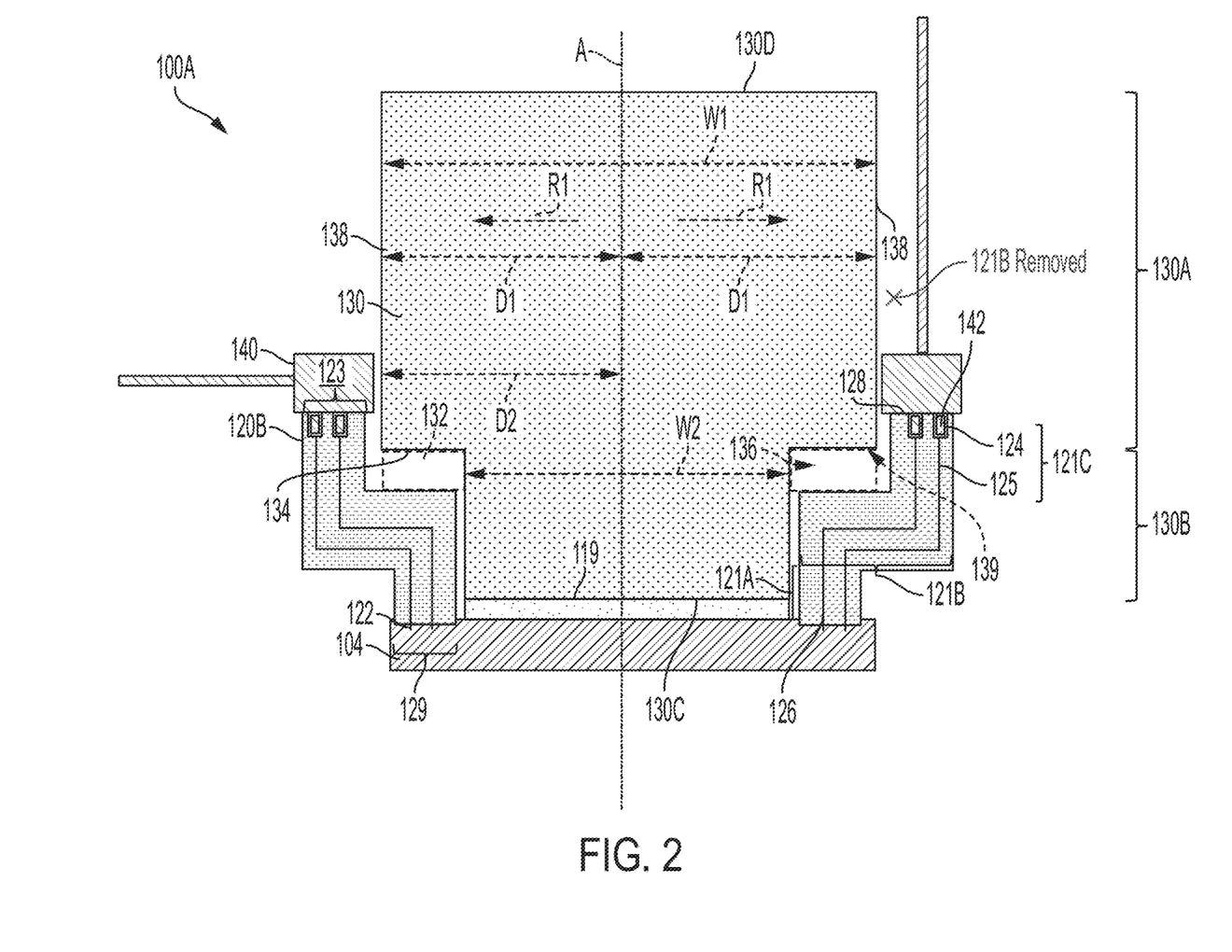
FIG. 2 is an illustration of electronic packaging locating a connector between a plug and a board outside the notched area of a mechanical component, in accordance with an embodiment of the present disclosure.
Figure 3:
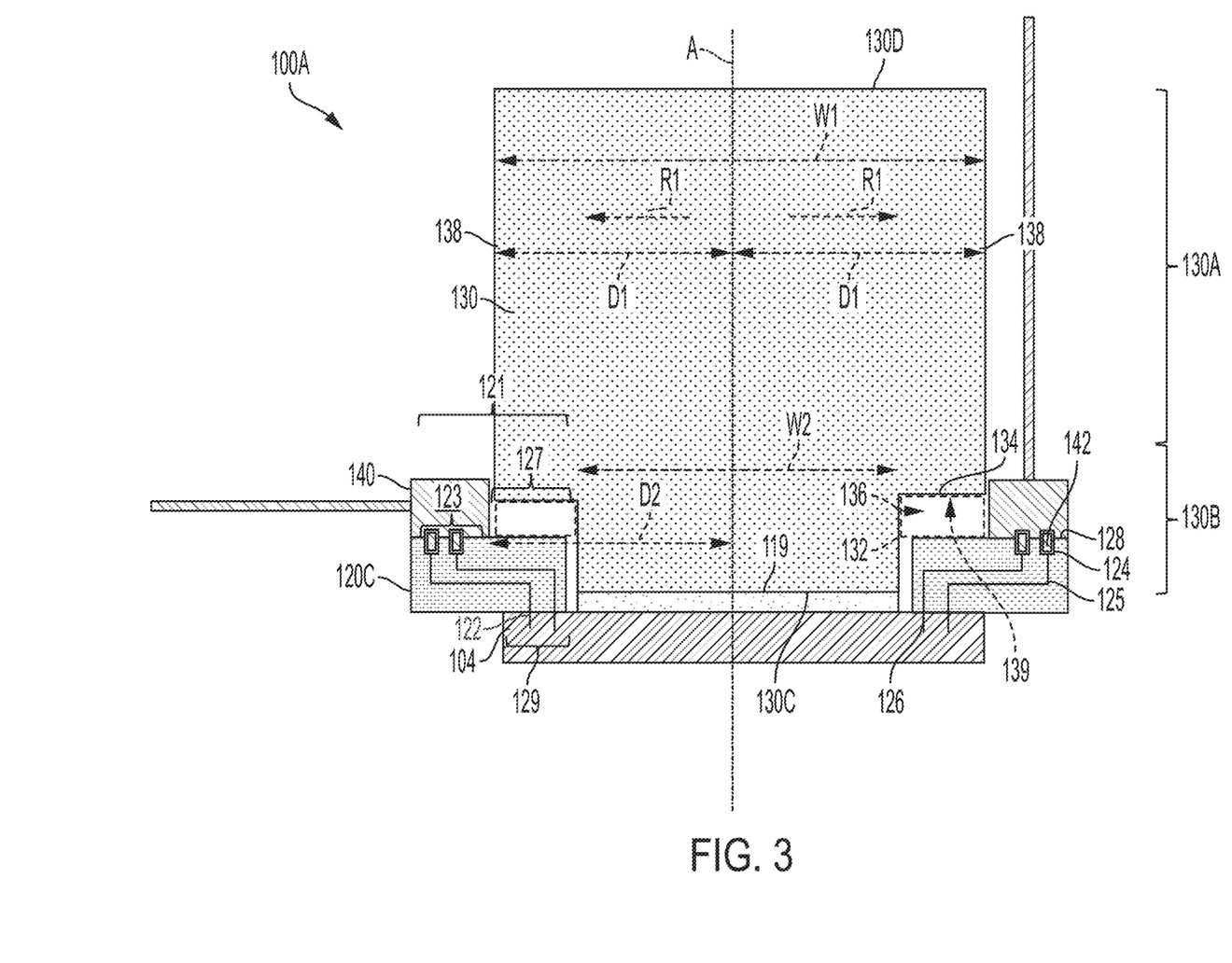
FIG. 3 is an illustration of electronic packaging locating a connector between a plug and a board outside the notched area of a mechanical component, in accordance with an embodiment of the present disclosure.
Figure 4:
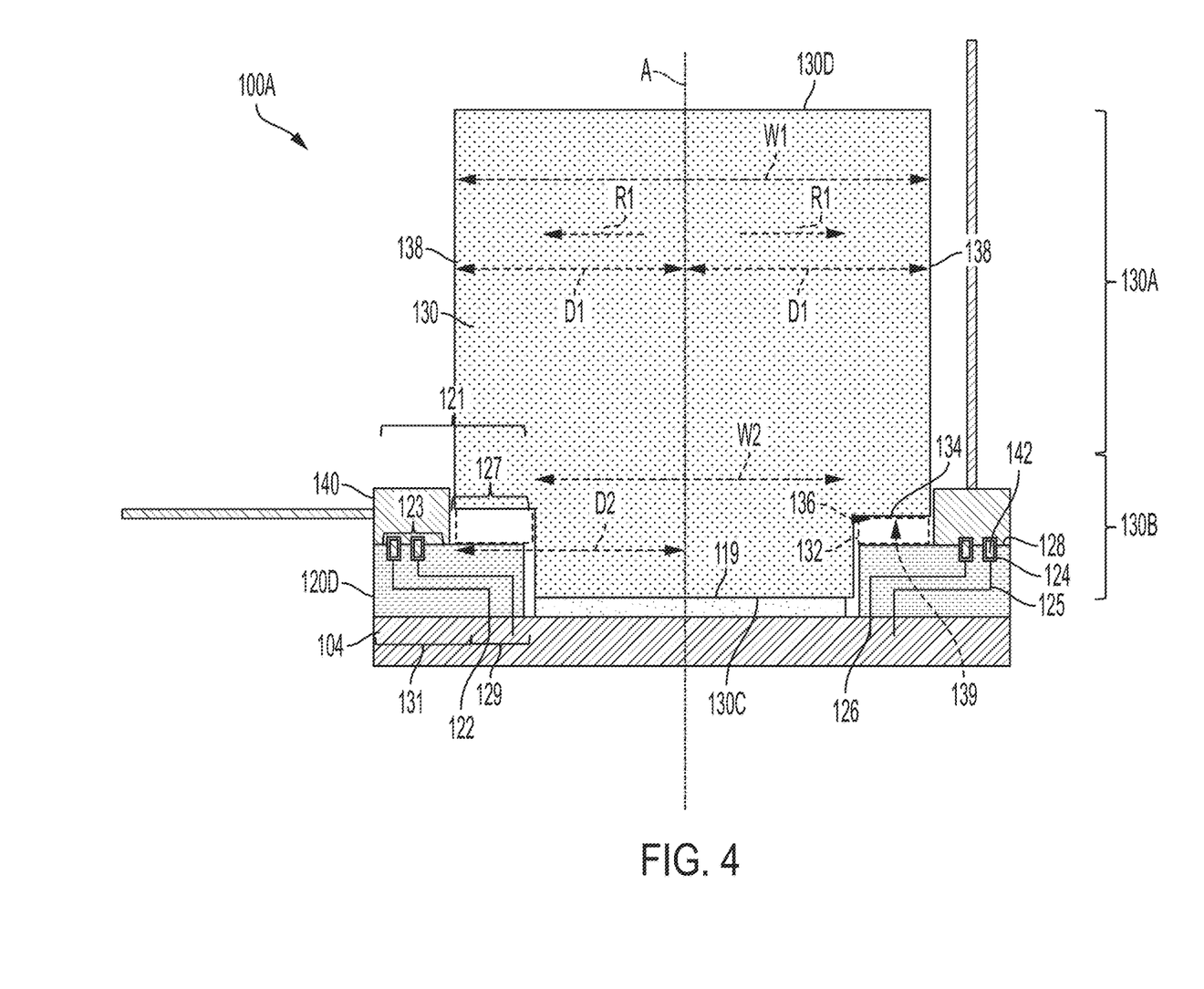
FIG. 4 is an illustration of electronic packaging locating a connector between a plug and a board outside the notched area of a mechanical component, in accordance with an embodiment of the present disclosure.

The upper portion 130A extends from the second end 130D to a seat 134 interposed between the second end 130D and the first end 130C. The lower portion 130B extends from the seat 134 to the first end 130C. The seat 134 includes a seat surface 139 in a facing spaced relationship with the board 104. The seat 134 may oriented parallel to the board 104. The upper portion 130A has a first width W1 and the lower portion 130B has a second width W2 that is less than the first width W1, as illustrated in FIGS. 1-4, such that a notched area 136 is formed between the seat surface 139 and the board 104. The difference between the first width W1 and the second width W2 creates the notched area 136 located proximate the seat 134. An obstruction 132 is located in the notch area 136. As illustrated in FIG. 1, the obstruction 132 may prevent the removal of the plug 140 without removing the mechanical component 130. The obstruction 132 may be part of the mechanical component 130 or may be attached to the mechanical component 130 at the seat surface 139 or proximate the seat surface 139. Embodiments disclosed herein seek to move the connection between the plug 140 and the connector 120 in a radially outward direction R1 out of the notched area 136, as illustrated in FIGS. 2-4. The radially outward direction R1 moves away from the central axis A. Moving the connection between the plug 140 and the connector 120 in a radially outward direction R1 out of the notched area 136 would move plug away from the obstruction 132. Advantageously, by moving the connection between the plug 140 and the connector 120 in a radially outward direction R1 out of the notched area 136 and move plug away from the obstruction 132, as in FIGS. 2-4, the mechanical component 130 does not need to be removed to remove the plugs 140, thus allowing the board 104 to maintain operations.

The upper portion 130A of the mechanical component 130 comprises one or more radially outward walls 138 that are oriented about perpendicular to the board 104, as shown in FIGS. 1-4. The radially outward walls 138 are located at a first distance D1 away from the central axis A. The central axis A may be the central axis of the mechanical component 130 bisecting the mechanical component down a middle of the mechanical component 130 between the radially outward walls 138.

The first surface 126 and the second surface 128 of the connector 120 are each oriented about parallel to the board 104. The first surface 126 is oriented about parallel to the second surface 128. The connector 120 includes a plug connection area 123 on the second surface 128 of the connectors 120. The plug connection area 123 is sized to receive a plug 140. In other words, the plug connection area 123 is about the size of the plug 140. The plug connection area 123 is the space that the plug 140 will take up or cover when the plug 140 is connected to the connector 120 (i.e., plug contacts 142 inserted into the connector contacts 124). In other words, the plug connection area 123 represents a foot print of the plug 140. In an embodiment, as illustrated in FIGS. 2-4, the plug connection area 123 is completely located at a second distance D2 away from the central axis A that is greater than the first distance D1, as measured away from the central axis A. In other words, as illustrated in FIGS. 2-4, the plug connection area 123 is completely located at a distance radially outside of the first distance D1, as measured away from the central axis A. The connector contacts 124 are located within the plug connection area 123. The plug 140 is configured to connect to the connector 120 when the connector contacts 124 receive or are within the plug contacts 142.

The connector 120 includes a board connection area 129 on the second surface 128 of the connectors 120. The board connection area 129 is sized to connect to the board 104. The board connection area 129 is the space or surface area that the connector tails 122 will take up or cover on the first surface 126. In other words, all of the connector tails 122 on the second surface are located within the board connection area 129. In an embodiment, the plug connection area 123 is horizontally offset from the board connection area 129, as illustrated in FIGS. 2-4. Advantageously, by horizontally offsetting the plug connection area 123 from the board connection area 129, the plug connection area 123 is moved out of the notched area 136 and away from the obstruction 132, as in FIGS. 2-4, thus the mechanical component 130 does not need to be removed to remove the plugs 140. This is as opposed to the connector 120A illustrated in FIG. 1, where the plug connection area 123 and the board connection area 129 are horizontally aligned. The first surface 131 may also include a non-board connection area 131 where no connector tails 122 are located, as illustrated in FIG. 4.

Referring now to FIG. 2, a connector 120B that moves the plug 140 outside of the notched area 136 is illustrated, in accordance with an embodiment of the present disclosure. The connector 120B of FIG. 2 has a bent or elbow shape that moves the plug 140 outside of the notched area 136. The internal electrical connections 125 follow the bent or elbow shape of the connector 120. The connector 120B includes multiple portions including a first portion 121A, a second portion 121B, and a third portion 121C. The first portion 121A is oriented about perpendicular to the board 104. The second portion 121B is oriented about parallel to the board 104. The third portion 121C is oriented about perpendicular to the board 104. The first portion 121A includes the first surface 126 of the connector 120, as illustrated in FIG. 2. The third portion 121C includes the second surface 128 of the connector 120, as illustrated in FIG. 2. The first portion 121A is attached or connected to the board 104 at the first surface 126 of the connector 120, as illustrated in FIG. 2. The third portion 121C is attached or connected to the plug 140 at the second surface 128 of the connector 120, as illustrated in FIG. 2. The second portion 121B is interposed between the first portion 121A and the third portion 121C. As illustrated in FIG. 2 the second surface 128 of the connector 120 is completely located at a second distance D2 that is greater than the first distance D1 away from the central axis A of the mechanical component 130. In other words, the second surface 128 of the connector 120 is located completely radially outside of the first width W1 of the mechanical component 130. In an embodiment, the third portion 121C is completely located at a second distance D2 that is greater than the first distance D1 away from the central axis A of the mechanical component 130. In an embodiment, the third portion 121C is located completely radially outside of the first width W1.

Referring now to FIG. 3, a connector 120C that moves the plug 140 outside of the notched area 136 is illustrated, in accordance with an embodiment of the present disclosure. The connector 120C of FIG. 3 has a linear shape that moves the plug 140 outside of the notched area 136. The internal electrical connections 125 follow a bend or elbow shape, as illustrated in FIG. 3. The connector 120C includes a single portion 121 that is oriented about parallel to the board 104. The single portion 121 includes the first surface 128 and the second surface 126. The single portion 121 extends past the first distance D1 to move the plug connection area 123 completely out of the notched area 136, while the non-plug area 127 of the second surface 128 remains in the notched area 136. As illustrated in FIG. 3, the second surface 128 includes the plug connection area 123 and the non-plug area 127. There are no connector contacts 124 located in the non-plug area 127. As illustrated in FIG. 3, the plug connection area 123 of the connector 120 is completely located at a second distance D2 that is greater than the first distance D1 away from the central axis A of the mechanical component 130. In other words, the plug connection area 123 of the connector 120 is located completely radially outside of the first width W1 of the mechanical component 130.

Referring now to FIG. 4, a connector 120D that moves the plug 140 outside of the notched area 136 is illustrated, in accordance with an embodiment of the present disclosure. The connector 120B of FIG. 2 has a linear shape that moves the plug 140 outside of the notched area 136. The internal electrical connections 125 follow a bend or elbow shape, as illustrated in FIG. 4. The connector 120D includes a single portion 121 that is oriented about parallel to the board 104 (i.e., module). The single portion 121 includes the first surface 128 and the second surface 128. The single portion 121 extends past the first distance D1 to move the plug connection area 123 completely out of the notched area 136, while the non-plug area 127 of the second surface 128 remains in the notched area 136. As illustrated in FIG. 4, the second surface 128 includes the plug connection area 123 and the non-plug area 127. There are no connector contacts 124 located in the non-plug area 127. As illustrated in FIG. 4, the plug connection area 123 of the connector 120 is completely located at a second distance D2 that is greater than the first distance D1 away from the central axis A of the mechanical component 130. In other words, the plug connection area 123 of the connector 120 is located completely radially outside of the width W1 of the mechanical component 130. As illustrated in FIG. 4, the board 104 may be extended radially outward in the radially outward direction R1 to fully support the first surface 126 of the connector 120D. In embodiment, the board 104 supports all of the first surface 126 of the connector 120D. In other words, the board 104 is in physical contact with all of the first surface 126 of the connector 120. Advantageously, the board 104 supports all of the first surface 126 of the connector 120D provides support for the connector 120D against the weight of the plug 140.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An electronic packaging, comprising:
   a board;
   a mechanical component attached to the board, the mechanical component comprising:
      a first end attached to the board;
      a second end opposite the first end;
      a seat interposed between the first end and the second end, the seat including a seat surface in a facing spaced relationship with the board;
      an upper portion extending from the second end to the seat, the upper portion having a first width;
      a lower portion extending from the seat to the first end, the lower portion having a second width that is less than the first width, such that a notched area is formed between the seat surface and the board; and
   a connector attached to the board, the connector comprising a first surface attached to the board; and
   a second surface located opposite the first surface, the second surface comprising a plug connection area sized to receive a plug, wherein the plug connection area is located completely radially outside of the first width.

2. The electronic packaging of claim 1, wherein the second surface is about parallel to the board.

3. The electronic packaging of claim 1, wherein the second surface further comprises a non-plug area.

4. The electronic packaging of claim 1, wherein the connector further comprises a single portion oriented about parallel to the board, the single portion including the first surface and the second surface.

5. The electronic packaging of claim 1, wherein the board supports all of the first surface of the connector.

6. The electronic packaging of claim 1, further comprising:
   connector contacts located within the plug connection area.

7. The electronic packaging of claim 1, further comprising:
   a plug connected to the second surface of the connector, the plug having plug contacts located within the connector contacts.

8. The electronic packaging of claim 1, wherein the connector further comprises:
   a first portion including the first surface attached to the board, the first portion being oriented about perpendicular to the board;
   a second portion about parallel to the board; and
   a third portion including the second surface, the third portion being oriented about perpendicular to the board.

9. The electronic packaging of claim 8, wherein the third portion is located completely radially outside of the first width.

10. An electronic packaging, comprising:
    a board;
    a mechanical component attached to the board, the mechanical component being centered on a central axis, wherein the mechanical component comprises:
       a first end attached to the board;
       a second end opposite the first end;
       a seat interposed between the first end and the second end, the seat including a seat surface in a facing spaced relationship with the board;
       an upper portion extending from the second end to the seat, the upper portion comprising a radially outward wall oriented about perpendicular to the board and located at a first distance away from the central axis;
       a lower portion extending from the seat to the first end; and
    a connector attached to the board, the connector comprising a first surface attached to the board; and
    a second surface located opposite the first surface, the second surface comprising a plug connection area sized to receive a plug, wherein the plug connection area is completely located at a second distance away from the central axis that is greater than the first distance.

11. The electronic packaging of claim 10, wherein the second surface is about parallel to the board.

12. The electronic packaging of claim 10, wherein the second surface further comprises a non-plug area.

13. The electronic packaging of claim 10, wherein the connector further comprises:
    a first portion including the first surface attached to the board, the first portion being oriented about perpendicular to the board;
    a second portion about parallel to the board; and a third portion including the second surface, the third portion being oriented about perpendicular to the board.

14. A connector configured to electrically connect to a board, the connector comprising
- a first surface comprising a board connection area;
- a connector tail configured to electrically connect to the board, the connector tail being located within the board connection area;
- a second surface located opposite the first surface, the second surface comprising a plug connection area sized to receive a plug, wherein the plug connection area is horizontally offset from the board connection area,
- a connector contact located within the plus connection area on the second surface, and
- an internal electrical connection contained completely within the connector, the internal electrical connection electrically connects the connector tail and the connector contact.

15. The connector of claim 14, wherein the second surface is about parallel to the first surface.

16. The connector of claim 14, wherein the second surface further comprises a non-plug area.

17. The connector of claim 14, wherein the second surface further comprises a non-board connection area.

18. The connector of claim 14, wherein the connector has a bent, elbow, or linear shape.

19. The connector of claim 14, wherein the internal electrical connection is composed of a first portion connected to the connector tails, a second portion connected to the connector contact, and a third portion connecting the first portion and the second portion,
- wherein the first portion is perpendicular to the first surface, the second portion is perpendicular to the first surface, and the third portion is nonparallel to the first portion and the second portion.

20. The connector of claim 19, wherein the third portion is parallel to the first surface.

* * * * *